United States Patent [19]
Fukunaga et al.

[11] Patent Number: 5,995,528
[45] Date of Patent: *Nov. 30, 1999

[54] SEMICONDUCTOR LASER

[75] Inventors: Toshiaki Fukunaga; Mitsugu Wada, both of Kanagawa-ken, Japan

[73] Assignee: Fuji Photo Film Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/827,445

[22] Filed: Mar. 28, 1997

[30]     Foreign Application Priority Data

Mar. 29, 1996   [JP]   Japan  .................................... 8-076301

[51] Int. Cl.$^6$ ..................................................... H01S 3/19
[52] U.S. Cl. ............................................. 372/45; 372/43
[58] Field of Search ................................. 372/45, 43, 44, 372/46

[56]             References Cited

U.S. PATENT DOCUMENTS

| | | | |
|---|---|---|---|
| 5,222,090 | 6/1993 | Serreze | 372/45 |
| 5,406,574 | 4/1995 | Rennie et al. | 372/45 |
| 5,528,614 | 6/1996 | Watanabe | 372/45 |
| 5,568,501 | 10/1996 | Otsuka et al. | 372/46 |
| 5,583,878 | 12/1996 | Shimizu et al. | 372/45 |
| 5,602,866 | 2/1997 | Fukunaga | 372/96 |
| 5,617,437 | 4/1997 | Fukunaga | 372/45 |
| 5,684,818 | 11/1997 | Anayama et al. | 372/46 |
| 5,715,266 | 2/1998 | Takagi | 372/45 |
| 5,727,015 | 3/1998 | Takahashi et al. | 372/96 |

OTHER PUBLICATIONS

Jpn. J. Appl. Phys. 31 (1992) L1686. Sep., Yoo et al. "Studies on the Low Local Temperature Rise in the Mirror Facet of a HP InGaAs P/GaAs Laser".

Appl. Phys. Lett. G2(1993) 1644, Apr., Zhang et al. "Strain–Compensated InGaAs/GaAsP/GaInAsP QW Lasers Grown by Gas–source Molecular Beam Epitaxy."

Appl. Phys. Lett. 39 (1981)134, No month. Tsang, "Hetero Structure Semiconductor Lasers Prepared by Molecular beam Epitaxy."

*Primary Examiner*—Rodney Bovernick
*Assistant Examiner*—Ellen E. Kang
*Attorney, Agent, or Firm*—Sughrue, Mion, Zinn, Macpeak & Seas, PLLC

[57]            ABSTRACT

A semiconductor laser includes a first clad layer, a first optical waveguide layer, a first barrier layer, an active layer, a second barrier layer, a second optical waveguide layer and a second clad layer formed in this order on a GaAs substrate which is a III-V group compound semiconductor. Each of the layers contains As and P, each of the first and second clad layers and the first and second optical waveguide layers is of a composition which matches with the GaAs substrate in lattice. The active layer is of a composition which induces compression strain on the GaAs substrate, and each of the first and second barrier layers is of a composition which induces tensile strain on the GaAs substrate, thereby compensating for the compression strain induced in the active layer.

3 Claims, 1 Drawing Sheet

SEMICONDUCTOR LASER

BACKGROUND OF THE INVENTION

1. Field of the Invention

This invention relates to a semiconductor laser, and more particularly to compositions of semiconductor layers of a semiconductor laser.

2. Description of the Related Art

As semiconductor lasers emitting a laser beam of 0.7 to 0.85 μm, there have been wide known those comprising an n-AlGaAs clad layer, an n- or i-AlGaAs optical waveguide layer, an i-AlGaAs active layer, a p- or i-AlGaAs optical waveguide layer, a p-AlGaAs clad layer and a p-GaAs capping layer formed on an n-GaAs substrate in this order. See, for instance, "Appl. Phys. Lett., 39(1981)134".

However this structure is disadvantageous in view of reliability in that since Al contained in the active layer is chemically active and is apt to be oxidized, the end face of the resonator formed by cleavage is apt to deteriorate.

Thus there has been proposed as described in "Jpn. J. Appl. Phys., 31(1992)L1686" a semiconductor laser comprising an n-InGaP clad layer, an n- or i-InGaAsP optical waveguide layer, an i-InGaAsP active layer, a p- or i-InGaAsP waveguide layer, a p-InGaP clad layer and a-GaAs capping layer formed on an n-GaAs substrate.

However this structure is disadvantageous in that diffusion of In takes place in the course of growth of the structure, which makes unstable the state of the crystal faces, and accordingly it is impossible to generate interfaces on opposite sides of the active layer at a high quality with a stable reproducibility.

Further as semiconductor lasers emitting a laser beam of 0.98 μm, there has been proposed as described, for instance, in "Appl. Phys. Lett., 62(1993)1644" those comprising an n-InGaP clad layer, an n- or i-InGaAsP optical waveguide layer, an i-GaAsP tensile strain barrier layer, an i-InGaAs compression strain active layer, an i-GaAsP tensile strain barrier layer, a p- or i-InGaAsP optical waveguide layer, a p-InGaP clad layer and a p-GaAs capping layer formed on an n-GaAs substrate.

However this structure is disadvantageous in the following points. That is, in crystal growth by MOCVD (metal organic chemical vapor deposition) method, a rapid substitution of As on P takes place upon switching of hydrogenated V group gases ($PH_3$, $AsH_3$) in the course of growth of the clad layer/optical waveguide layer interfaces and the barrier layer/active layer interfaces or growth reverse thereto, which makes unstable the state of the crystal faces. Accordingly it is impossible to generate the interfaces at a high quality with a stable reproducibility and the quality of crystals grown on the interfaces deteriorates.

SUMMARY OF THE INVENTION

In view of the foregoing observations and description, the primary object of the present invention is to provide a strain quantum well type semiconductor laser which emits a laser beam of 0.75 to 1.1 μm and is highly reliable even during oscillation at a high power.

In accordance with the present invention, there is provided a semiconductor laser comprising a first clad layer, a first optical waveguide layer, a first barrier layer, an active layer, a second barrier layer, a second optical waveguide layer and a second clad layer formed in this order on a GaAs substrate which is a III-V group compound semiconductor, wherein the improvement comprises that each of said layers contains As and P, each of the first and second clad layers and the first and second optical waveguide layers is of a composition which matches with the GaAs substrate in lattice, said active layer is of a composition which induces compression strain on the GaAs substrate, and each of the first and second barrier layers is of a composition which induces tensile strain on the GaAs substrate, thereby compensating for the compression strain induced in the active layer.

In one embodiment, the active layer is of a composition $In_{x1}Ga_{1-x1}As_{1-y1}P_{y1}$ ($0.97 \geq y1 \geq 0.03$), each of the first and second barrier layers is of a composition $Ga_{1-z2}Al_{z2}As_{1-y2}P_{y2}$ ($0.97 \geq y2 \geq 0.05$), each of the first and second optical waveguide layers is of a composition $In_{x3}(Ga_{1-z3}Al_{z3})_{1-x3}As_{1-y3}P_{y3}$ ($0.97 \geq y3 \geq 0.03$), and each of the first and second clad layers is of a composition $In_{x4}(Ga_{1-z4}Al_{z4})_{1-x4}As_{1-y4}P_{y4}$ ($0.97 \geq y4 \geq 0.03$).

In another embodiment, the active layer is of a composition $In_{x1}Ga_{1-x1}As_{1-y1}P_{y1}$ ($0.97 \geq y1 \geq 0.03$), each of the first and second barrier layers is of a composition $In_{x5}Ga_{1-x5}As_{1-y5}P_{y5}$ ($x5 \leq 0.1$, $0.97 \geq y5 \geq 0.03$), each of the first and second optical waveguide layers is of a composition $In_{x3}(Ga_{1-z3}Al_{z3})_{1-x3}As_{1-y3}P_{y3}$ ($0.97 \geq y3 \geq 0.03$), and each of the first and second clad layers is of a composition $In_{x4}(Ga_{1-z4}Al_{z4})_{1-x4}As_{1-y4}P_{y4}$ ($0.97 \geq y4 \geq 0.03$).

In the semiconductor laser in accordance with the present invention, since the content of In in the barrier layers on opposite sides of the active layer is small, diffusion of In into the active layer can be suppressed and the sharpness of the hetero-interfaces of the active layer is not deteriorated, whereby a highly reliable device can be obtained.

Further since the active layer contains no Al and the compression strain of the active layer is compensated for by the barrier layers, reliability of the device is improved.

Further with the layer arrangement in accordance with the present invention, influence of switching of hydrogenated V group gases on the other layers during crystal growth by MOCVD can be minimized, whereby mutual substitution of V group elements at the interfaces between adjacent layers can be suppressed, the growth interruption time at the interfaces can be shortened and a laser structure can be produced without generation of defect in the interfaces. As a result, reliability of the device can be improved.

Thus in accordance with the present invention, a laser structure can be produced without deterioration of hetero-interfaces which form the active layer during crystal growth and accordingly a laser which is highly reliable even during oscillation at a high power can be provided.

DESCRIPTION OF THE PREFERRED EMBODIMENT

Figure 1:
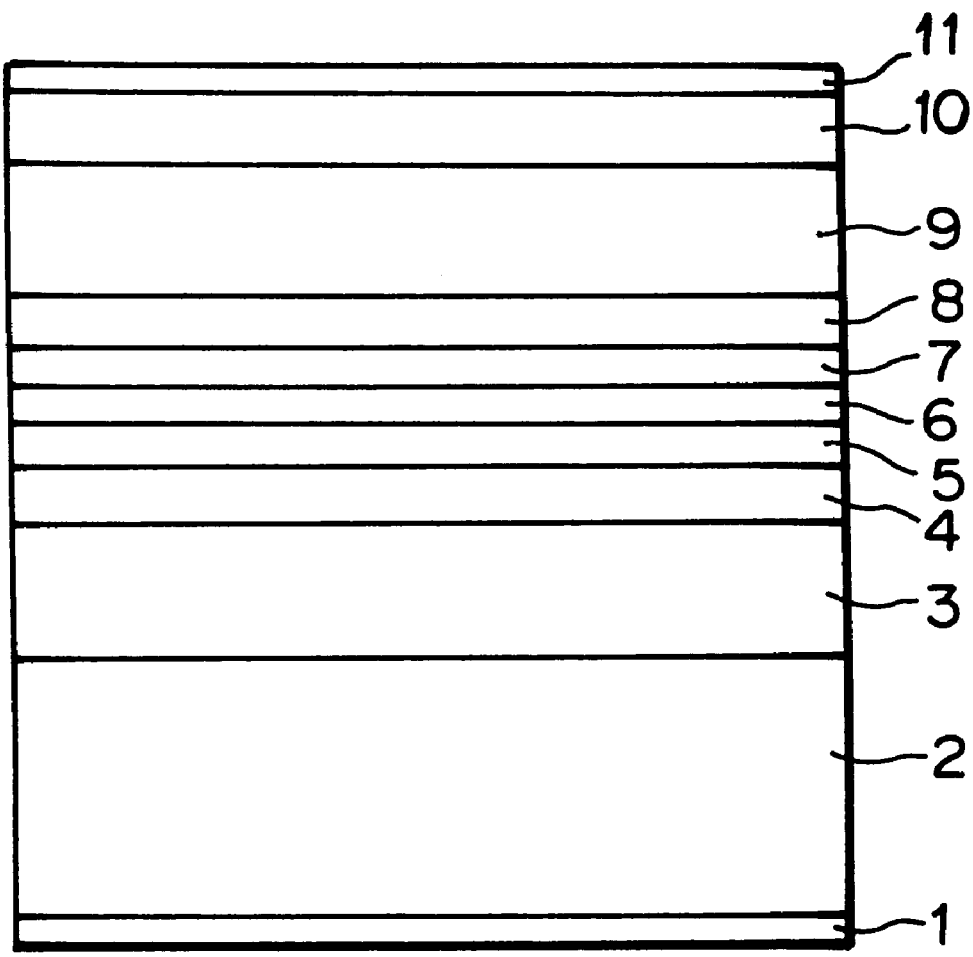
FIG. 1 is a schematic cross-sectional view of a semiconductor laser in accordance with an embodiment of the present invention.

The semiconductor laser in accordance with an embodiment of the present invention is produced in the following manner. By use of trimethyl aluminum (TMA), trimethyl gallium (TMG) and trimethyl indium (TMI) as III group organic metals and AsH3 and PH3 as hydrogenated V group gases, an n-$In_{x4}(Ga_{1-z4}Al_{z4})_{1-x4}As_{1-y4}P_{y4}$ clad layer 3, an n- or i-$In_{x3}(Ga_{1-z3}Al_{z3})_{1-x3}As_{1-y3}P_{y3}$ optical waveguide layer 4, an i-$Ga_{1-z2}Al_{z2}As_{1-y2}P_{y2}$ tensile strain barrier layer 5, an i-$In_{x1}Ga_{1-x1}As_{1-y1}P_{y1}$ compression strain active layer 6, an i-$Ga_{1-z2}Al_{z2}As_{1-y2}P_{y2}$ tensile strain barrier layer 7, a p- or i-$In_{x3}(Ga_{1-z3}Al_{z3})_{1-x3}As_{1-y3}P_{y3}$ optical waveguide layer 8, a p-$In_{x4}(Ga_{1-z4}Al_{z4})_{1-x4}As_{1-y}4P_{y4}$ clad layer 9 and a p-GaAs contact layer 10 are grown successively on an n-GaAs substrate 2 in this order by a MOCVD apparatus.

Each of the clad layers 3 and 9 and the optical waveguide layers 4 and 8 is of a composition which matches with the GaAs substrate 2 in lattice. The thickness of each of the tensile strain barrier layers 5 and 7 for compensating for strain of the active layer 6 is set so that defect such as dislocation is not generated during crystal growth and the strain of each of the tensile strain barrier layers 5 and 7 is set so that the compression strain of the active layer 6 is compensated for by the tensile strain of both the barrier layers 5 and 7 on opposite sides of the active layer 6. Since all the layers except the contact layer 10 are of compositions containing both As and P, $AsH_3$ and $PH_3$ gases need not be completely cut during crystal growth by MOCVD, that is, both the gases may be constantly supplied to the surface of growth more or less during crystal growth, mutual substitution of P and As can be minimized at each hetero interface, whereby hetero interfaces can be stably formed.

The semiconductor laser of this embodiment is completed by subsequently forming metal electrodes 1 and 11 respectively on the substrate 2 and the contact layer 11.

Though the semiconductor laser of this embodiment is of a simple double hetero structure, the structure may be further processed by the normal photolithography and/or etching into a semiconductor laser with index optical waveguide mechanism, a semiconductor laser with diffraction grating, an optical integrated circuit and the like.

Though the semiconductor laser of this embodiment is of a so-called SCH-SQW structure having a single quantum well and a pair of optical waveguides of the same compositions, a multiple quantum well structure (MQW) having a plurality of quantum wells may be employed in place of SQW. The optical waveguide layers may be of a GRIN (graded-index) structure. Also in this case, a desired refracting index profile can be obtained by gently changing the ratio of the flow rates of TMA and TMG without switching the hydrogenated V group gases. Further the tensile strain barrier layer may be formed of $In_{x5}Ga_{1-x5}As_{1-y5}P_{y5}$ ($x5 \leq 0.1$) containing a small amount of In. When In is equal to or less than about 10% of III group elements, diffusion of In into the active layer can be suppressed.

The oscillating wavelength of the semiconductor laser can be controlled in the range of 750 nm to 1100 nm by the $In_{x1}Ga_{1-x1}As_{1-y1}P_{y1}$ active layer.

As a special case of the embodiment described above, the proportions of As in the respective layers except the p-GaAs contact layer 10 may be equal to each other, that is, y1=y2=y3=y4, and in this case, also the proportions of P in the respective layers except the p-GaAs contact layer 10 become equal to each other. As another special case of the embodiment described above, the proportions of As in the respective layers except the p-GaAs contact layer 10 and the $In_{x1}Ga_{1-x1}As_{1-y1}P_{y1}$ active layer 6 may be equal to each other, that is, y2=y3=y4, and in this case, also the proportions of P in the respective layers except the p-GaAs contact layer 10 and the $In_{x1}Ga_{1-x1}As_{1-y1}P_{y1}$ active layer 6 become equal to each other. As still another special case of the embodiment described above, the proportions of As in the respective layers except the p-GaAs contact layer 10, the $In_{x1}Ga_{1-x1}As_{1-y1}P_{y1}$ active layer 6 and the i-$Ga_{1-z2}Al_{z2}As_{1-y2}P_{y2}$ tensile strain barrier layers 5 and 7 may be equal to each other, that is, y3=y4, and in this case, also the proportions of P in the respective layers except the p-GaAs contact layer 10, the $In_{x1}Ga_{1-x1}As_{1-y1}P_{y1}$ active layer 6 and the i-$Ga_{1-z2}Al_{z2}As_{1-y2}P_{y2}$ tensile strain barrier layers 5 and 7 become equal to each other. Further the composition may be such that y1=y2 with y3=y4, or y1=y2=y3. Further crystal growth may be effected also by a molecular beam epitaxial growth method using solid or gaseous raw materials.

What is claimed is:

1. A semiconductor laser comprising a first clad layer, a first optical waveguide layer, a first barrier layer, an active layer, a second barrier layer, a second optical waveguide layer and a second clad layer formed in this order on a GaAs substrate which is a III-V group compound semiconductor, wherein the improvement comprises that each of said layers contains As and P, each of the first and second clad layers and the first and second optical waveguide layers is of a composition which matches with the GaAs substrate in lattice, said active layer is of a composition which induces compression strain on the GaAs substrate, and each of the first and second barrier layers is of a composition which induces tensile strain on the GaAs substrate, thereby compensating for the compression strain induced in the active layer.

2. A semiconductor laser as defined in claim 1 in which the active layer is of a composition $In_{x1}Ga_{1-x1}As_{1-y1}P_{y1}$ ($0.97 \geq y1 \geq 0.03$), each of the first and second barrier layers is of a composition $Ga_{1-z2}Al_{z2}As_{1-y2}P_{y2}$ ($0.97 \geq y2 \geq 0.05$), each of the first and second optical waveguide layers is of a composition $In_{x3}(Ga_{1-z3}Al_{z3})_{1-x3}As_{1-y3}P_{y3}$ ($0.97 \geq y3 \geq 0.03$), and each of the first and second clad layers is of a composition $In_{x4}(Ga_{1-z4}Al_{z4})1-X_4As_{1-y4}P_{y4}$ ($0.97 \geq y4 \geq 0.03$), wherein 0<A<1 and A is z2, z3, x3, x4 or z4, and 0<x1 <0.5.

3. A semiconductor laser as defined in claim 1 in which the active layer is of a composition $In_{x1}Ga_{1-x1}As_{1-y1}P_{y1}$ ($0.97 \geq y1 \geq 0.03$), each of the first and second barrier layers is of a composition $In_{x5}Ga_{1-x5}As_{1-y5}P_{y5}$ ($x5 \geq 0.1$, $0.97 \geq y5 \geq 0.03$), each of the first and second optical waveguide layers is of a composition $In_{x3}(Ga_{1-z3}Al_{z3})_{1-x3}As_{1-y3}P_{y3}$ ($0.97 \geq y3 \geq 0.03$), and each of the first and second clad layers is of a composition $In_{x4}(Ga_{1-z4}Al_{z4})_{1-4}As_{1-y4}P_{y4}$ ($0.97 \geq y4 \geq 0.03$), wherein 0<B<1 and B is x5, x3, z3, x4 or z4 and 0<x1 <0.5.

* * * * *